(12) United States Patent
Verslegers et al.

(10) Patent No.: US 11,564,312 B2
(45) Date of Patent: Jan. 24, 2023

(54) LASER LIGHT SOURCE CO-PACKAGED WITH PHOTONIC INTEGRATED CIRCUIT AND SUBSTRATE

(71) Applicant: Google LLC, Mountain View, CA (US)

(72) Inventors: Lieven Verslegers, San Mateo, CA (US); Hong Liu, Palo Alto, CA (US); Kevin Yasumura, Lafayette, CA (US); Jill Berger, Saratoga, CA (US); Ryohei Urata, San Carlos, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/034,867

(22) Filed: Sep. 28, 2020

(65) Prior Publication Data

US 2022/0104342 A1 Mar. 31, 2022

(51) Int. Cl.
*H05K 1/02* (2006.01)
*G02B 6/12* (2006.01)
*G02B 6/42* (2006.01)

(52) U.S. Cl.
CPC .............. *H05K 1/0274* (2013.01); *G02B 6/12* (2013.01); *H05K 1/0203* (2013.01); *G02B 6/4269* (2013.01); *H05K 2201/10098* (2013.01); *H05K 2201/10606* (2013.01)

(58) Field of Classification Search
CPC ................................. G02B 6/12; G02B 6/4209
See application file for complete search history.

(56) References Cited

U.S. PATENT DOCUMENTS

| 7,352,923 | B2 | 4/2008 | Mazed |
| 7,519,246 | B2 | 4/2009 | Welch et al. |
| 9,370,123 | B2 | 6/2016 | Blumenthal |

(Continued)

FOREIGN PATENT DOCUMENTS

| CN | 105259623 A | 1/2016 |
| CN | 107820575 A | 3/2018 |

(Continued)

OTHER PUBLICATIONS

Tekin, Tolga, Review of Packaging of Optoelectronic, Photonic, and MEMS Components, IEEE Journal of Selected Topics in Quantum Electronics, vol. 17, No. 3, May/Jun. 2011, 17 pages.

(Continued)

*Primary Examiner* — Tina M Wong
(74) *Attorney, Agent, or Firm* — Lerner, David, Littenberg, Krumholz & Mentlik, LLP

(57) ABSTRACT

The present disclosure provides for an example integrated optics assembly. The integrated optics assembly may include an optics mount, a substrate including a heat sink, and a photonic integrated circuit ("PIC"). The optics mount may be adapted to support a light source on a first end of the optics mount. The first end of the optics mount may be coupled to a region of the substrate including the heat sink. The heat sink may remove or dissipate the heat produced by the light source. A second end of the optics mount may be coupled to the PIC such that the optics mount extends between the substrate and the PIC. This may decrease the amount of space the optics mount takes up on the PIC thereby allowing the overall size of the PIC to be decreased. Decreasing the size of the PIC may allow for more PICS per wafer.

18 Claims, 4 Drawing Sheets

(56) References Cited

U.S. PATENT DOCUMENTS

| | | |
|---|---|---|
| 9,976,844 B2 | 5/2018 | Lloret Soler et al. |
| 10,025,047 B1 | 7/2018 | Liu et al. |
| 10,146,020 B1 | 12/2018 | Yasumura et al. |
| 10,243,322 B2 | 3/2019 | Mahgerefteh et al. |
| 10,466,433 B2* | 11/2019 | Epitaux ............... G02B 6/4214 |
| 10,775,559 B2* | 9/2020 | Watts ................. H01S 5/02469 |
| 2016/0266322 A1 | 9/2016 | Epitaux et al. |
| 2017/0207600 A1 | 7/2017 | Klamkin et al. |
| 2018/0031791 A1 | 2/2018 | Israel et al. |
| 2018/0164520 A1* | 6/2018 | Epitaux ............... G02B 6/3652 |
| 2019/0033542 A1 | 1/2019 | Epitaux et al. |
| 2022/0104342 A1* | 3/2022 | Verslegers ........... H05K 1/0203 |

FOREIGN PATENT DOCUMENTS

| | | |
|---|---|---|
| CN | 108027480 A | 5/2018 |
| CN | 208256644 U | 12/2018 |
| CN | 210605074 U | 5/2020 |
| JP | H1152193 A | 2/1999 |
| WO | 2017062075 A1 | 4/2017 |

OTHER PUBLICATIONS

Carroll, et al., Photonic Packaging: Transforming Silicon Photonic Integrated Circuits into Photonic Devices, Appl. Sci. 2016, 6, 426, 21 pages.

Billah et al., Hybrid Integration of Silicon Photonics Circuits and InP Lasers by Photonic Wire Bonding, 2018 Optical Society of America, 9 pages.

Bowers, et al., A Comparison of Four Approaches to Photonic Integration, OFC 2017, 3 pages.

Extended European Search Report for European Patent Application No. 21156140.2 dated Jul. 5, 2021. 8 pages.

Notification of First Office Action for Chinese Patent Application No. 202110043755.X dated Feb. 22, 2022. 8 pages.

* cited by examiner

LASER LIGHT SOURCE CO-PACKAGED WITH PHOTONIC INTEGRATED CIRCUIT AND SUBSTRATE

BACKGROUND

Silicon photonics technology enables low-cost, low-power, high-speed optical solutions for data-communications and tele-communications by scaling transceiver channels and data rates through photonic integration and electronic co-packaging. A light source, such as a laser, is mounted on a photonic integrated circuit ("PIC"). The light source provides a beam of light that is directed towards a grating coupler on the PIC, which couples the light into the waveguide on the PIC. The PIC, however, does not offer an efficient thermal path for the light source. Poor heat sinking degrades the efficiency of the light source, limits the available output power of the light source, and reduces an optical link budget. The light source may be positioned adjacent to the PIC such that the light is coupled to the PIC through an edge coupler. However, this requires controlling the height of various elements and/or precise alignment, which is difficult. This configuration also increases the footprint, or size, of the system.

BRIEF SUMMARY

The present disclosure provides an improved integrated optics assembly, including an optics mount that extends between a PIC and a substrate, such that the optics mount acts as a bridge between the PIC and the substrate. Bridging the substrate and PIC via the optics mount reduces the footprint of the optics mount on the PIC. This may allow for the overall size of the PIC to be reduced, which may allow for more PICs to be located on each wafer.

The substrate may include a heat sink. The optics mount may include a light source positioned on a first end of the optics mount. The first end of the optics mount may be coupled to a region of the substrate including the heat sink. The heat sink may increase the thermal efficiency of the integrated optics assembly by extracting heat from the light source. This may allow the light source to deliver more optical power and, therefore, more link budget. The link budget accounts for all the power gains and losses that a communications signal experiences from the transmitter which includes the integrated optics assembly, through an optical fiber, to the receiver.

One aspect of the disclosure includes a system comprising a photonic integrated circuit (PIC), a substrate or printed circuit board ("PCB") including a heat sink, and an optics mount adapted to support a light source on a first end of the optics mount, wherein the first end of the optics mount is coupled to a region of the substrate or PCB including the heat sink and a second end of the optics mount is coupled to the PIC.

The heat sink may be embedded in the substrate. The heat sink may have a first top surface and the substrate or the PCB has a second top surface. The first top surface and the second top surface may be on a first plane.

The optics mount may be coupled to the region of the substrate or the PCB via solder or epoxy. The heat sink may be removably coupled to the substrate or the PCB. The second end of the optics mount may be coupled to the PIC via optical epoxy.

The optics mount may further include one or more electrical connections between the substrate or the PCB and the PIC. When the first end of the optics mount is coupled to the region of the substrate or the PCB and the second end of the optics mount is mechanically coupled to the PIC, a first edge of the substrate or the PCB and a first edge of the PIC may define a gap.

The substrate may have a u-shape. The PIC may be received within the indentation of the u-shaped substrate.

The optics mount may comprise a lens configured to focus a beam of light from the light source, and a prism or a microelectromechanical systems (MEMS) mirror positioned on the second end of the optics mount, wherein the prism or the MEMS mirror is configured to receive the beam of light from the lens and redirect it towards the PIC.

The system may further comprise a plurality of optics mounts, wherein the first end of each of the plurality of optics mounts is coupled to the substrate or the PCB and the second end of each of the plurality of optics mounts is coupled to the PIC. The system may further include a radio frequency integrated circuit or radio frequency bridge configured to couple to both the substrate or the PCB and the PIC.

Another aspect of disclosure includes a method of manufacturing an integrated optics assembly comprising providing a photonic integrated circuit (PIC), providing a substrate including a heat sink, providing an optics mount adapted to support a light source on a first end of the optics mount, coupling the first end of the optics mount to a region of the substrate including the heat sink, and coupling a second end of the optics mount to the PIC.

DETAILED DESCRIPTION

An integrated optics assembly may include an optics mount, a substrate, and a PIC. The optics mounts may be adapted to support a light source. The optics mount may bridge or couple the substrate and the PIC. For example, a first end of the optics mount may be coupled to the substrate and a second end of the optics mount may be coupled to the PIC. The light source may be positioned on the end of the optics mount that is coupled to the substrate.

The substrate may include a heat sink. The heat sink may have a relatively high, thermal conductivity as compared to the PIC. For example, the heat sink may be made of copper, metal vias, thermal vias, a combination of metal traces and metal vias, etc. The end of the optics mount with the light source may be positioned in a region of the substrate including the heat sink. The heat sink may remove or dissipate the heat from the light source to prevent the integrated optics assembly from exceeding a predetermined threshold and, therefore, may prevent thermal rollover.

In some examples, the optics mount may include additional components, such as a lens, an isolator, and a prism or a microelectromechanical ("MEMS") mirror. The light source may provide a beam of light towards the lens. The lens may focus the beam of light through the isolator and towards the prism or MEMS mirror. The prism or MEMS mirror may redirect the beam of light into a grating coupler on the PIC.

The integrated optics assembly may additionally include one or more radio frequency ("RF") integrated circuits ("IC") and/or bridge ICs.

The configuration of the optics mount extending between the substrate and the PIC may increase the performance of the integrated optics assembly. For example, the configuration may provide for greater accuracy in controlling the height between the PIC and substrate which may be required for the RFIC and/or bridge IC. The configuration may reduce the footprint of the optics mount on the PIC. By reducing the footprint of the optics mount on the PIC, the size of the PIC may be reduced which would allow for more PICs per wafer. Additionally or alternatively, reducing the portion of the optics mount on the PIC may allow for the integrated optics assembly to be more compact.

Figure 1:
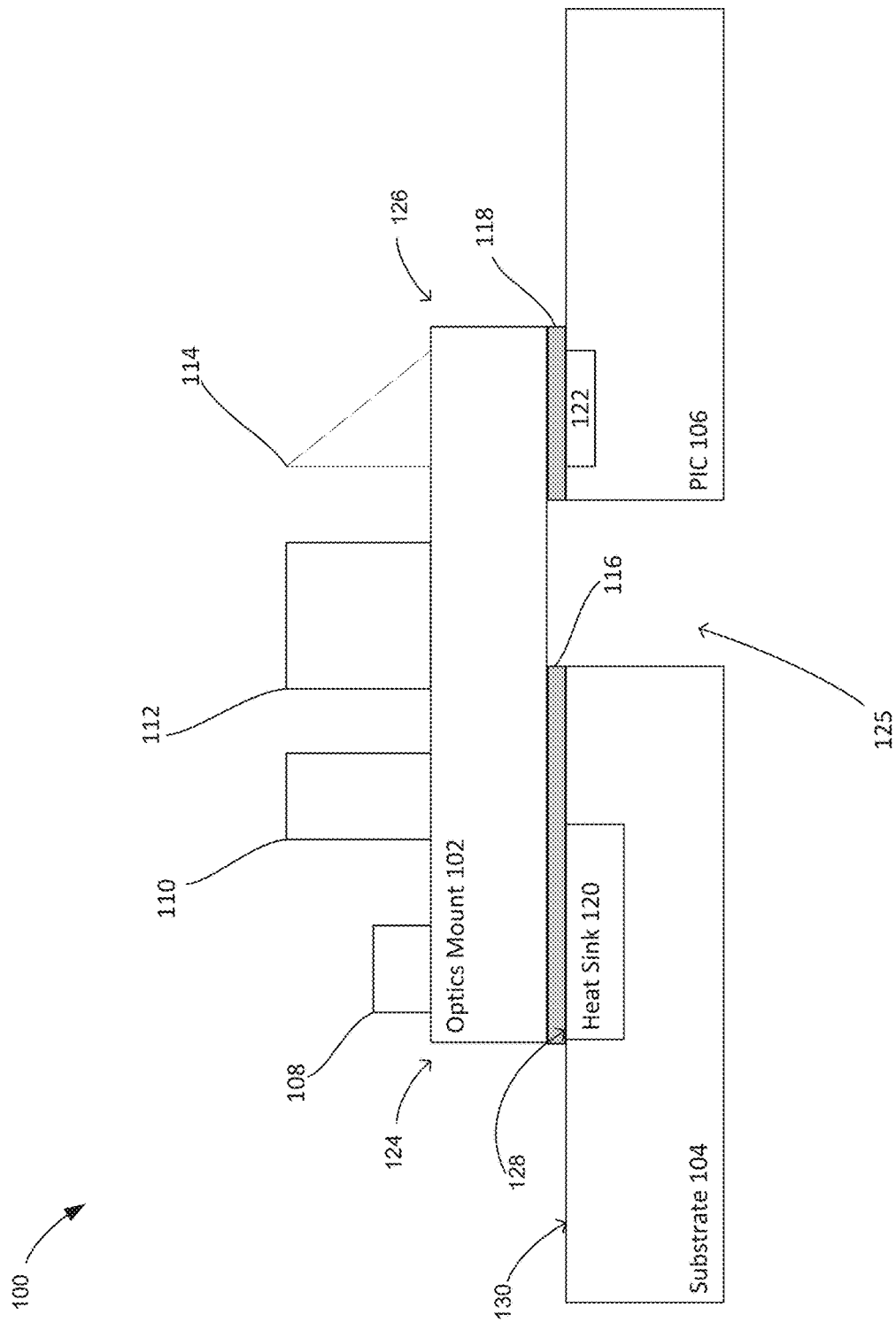
FIG. 1 is a cross-sectional view of an integrated optics assembly according to aspects of the disclosure.

FIG. 1 illustrates a cross section of an integrated optics assembly. The integrated optics assembly 100 may include an optics mount 102, substrate 104, and PIC 106.

The optics mount 102 may be made of silicon and/or one or more silicon blocks or wafers. The optics mount 102 may include a light source 108, lens 110, isolator 112, and a prism 114. According to some examples, the prism 114 may be replaced with a microelectromechanical ("MEMS") mirror.

Light source 108 may be coupled to optics mount 102 on a first end 124 of optics mount 102 with solder. Light source 108 may provide a beam of light. For example, light source 108 may be a laser.

Lens 110 may be coupled to the optics mount 102 with a layer of epoxy, solder, or other coupling mechanism. Lens 110 may be positioned to receive the beam of light from light source 108. Lens 110 may be configured to focus the beam of light received from light source 108.

Isolator 112 may be coupled to optics mount 102 with a layer of epoxy, solder, or other coupling mechanism. Isolator 112 may be configured to pass the beam of light from light source 108 in a first direction but may prevent or block any light from passing in a second, or reverse, direction. For example, isolator 112 may receive the focused beam of light from lens 110 as the beam of light travels from first end 124 of optics mount 102 towards second end 126 of optics mount 102. The second or reverse direction may be a direction towards the light source 108, or in a direction from second end 126 of optics mount 102 towards first end 124 of optics mount 102. According to some examples, isolator 112 may block light that is reflected back from the interface between free space and optics mount 102. Additionally or alternatively, isolator 112 may block light that is reflected back from the interface between optics mount 102 and PIC 106. According to some examples, isolator 112 may block light that is reflected back from the surface of grating coupler 122 and directed by the prism 114 or MEMS mirror towards light source 108. The isolator may also block light that is reflected back from any component inside PIC 106, such as light reflected from the waveguides, modulators, splitters, multiplexers, edge couplers, etc.

Prism 114 may be coupled to optics mount 102 on a second end 126 of optics mount 102. Prism 114 may be coupled to optics mount 102 with epoxy, such as optical epoxy. Prism 114 may be configured to redirect light from light source 108 towards the PIC 106 and/or grating coupler 122. According to some examples, prism 114 may receive the focused beam of light from lens 110. In some examples, prism 114 may receive the focused beam of light after the focused beam of light passes through isolator 112.

In examples where integrated optics assembly 100 includes a MEMS mirror instead of prism 114, the MEMS mirror may be coupled to optics mount 102. The MEMS mirror may be coupled to optics mount 102 with epoxy, solder, or other coupling mechanisms. The optics mount 102 may additionally include a control to execute certain operations, such as controlling a position of a reflective portion of the MEMS mirror. For example, the MEMS mirror may include a controllable element to adjust and/or tilt the position of the reflective portion to set a desired angle of incidence of the beam of light from light source 108 on grating coupler 122.

Substrate 104 may include a heat sink 120. Heat sink 120 may be included as part of substrate 104. According to some examples, the integrated optics assembly 100 may include a printed circuit board ("PCB") instead of or in addition to substrate 104. In examples where integrated optics assembly 100 includes a PCB, the PCB may include a heat sink as described herein with respect to substrate 104.

Heat sink 120 may be thermally conductive. According to some examples, heat sink 120 may have a higher thermal conductivity than PIC 106. The heat sink 120 may be made of copper, one or more metal vias, one or more thermal vias, and/or a combination of one or more metal traces and thermal vias. In some examples, heat sink 120 may be formed by a plurality of thermally conductive metal layers. At least one metal layer may be etched to form the metal traces. According to some examples, the thermal vias may be made of heat conducting material. The thermal vias may carry heat away from the components coupled to heat sink 120. For example, the thermal vias may carry heat away from light source 108.

Heat sink 120 may be embedded in substrate 104. For example, heat sink 120 may have a top surface 128 and substrate 104 may have a top surface 130. When heat sink 120 is embedded in substrate 104, top surface 128 of heat sink 120 may align or be co-planar with top surface 130 of substrate 104. In some examples, heat sink 120 may not be embedded and/or fully embedded in substrate 104. In such an example, top surface 128 of heat sink 120 may be in a first horizontal plane and top surface 130 of substrate 104 may be in a second horizontal plane. The first horizontal plane and second horizontal plane may be spaced a predetermined distance. In some examples, the first horizontal plane and the second horizontal plane may be parallel or substantially parallel to each other.

According to some examples, heat sink 120 may be removable from substrate 104. For example, heat sink 120 may be coupled to substrate 104 by one or more clips, screws or other coupling mechanisms. By configuring heat sink 120 to be removable from substrate 104, it may be easier to rework or reconfigure integrated optics assembly 100.

Light source 108 may produce heat that may damage the PIC 106. The heat may cause integrated optics assembly 100 to exceed a predetermined temperature. When integrated optics assembly 100 exceeds the predetermined temperature, integrated optics assembly 100 may enter thermal rollover such that the integrated optics assembly 100 loses power. To remove and/or dissipate the heat from light source 108, the first end 124 of the optics mount 102 may be coupled to substrate 104 in a region of substrate 104 that includes heat sink 120. The first end 124 of optics mount 102 may be coupled to substrate 104 with solder or epoxy 116. According to some examples, the first end 124 of optics mount 102 may be coupled to substrate 104 by one or more clips, screws, or other coupling mechanisms.

By positioning the first end 124 of the optics mount 102 in the region of substrate 104 having heat sink 120, the thermal performance of integrated optics assembly 100 may increase. For example, the configuration may increase the ability to extract heat from the top of substrate 104 and/or light source 106 as substrate 104 may have fewer constraints as compared to the PIC. As a result, light source 108 may deliver more optical power which may increase the link budget. Increased power from light source 108 may reduce the requirement on other components for integrated photonics and/or packaging. For example, the requirements on component losses and other link impairments may be reduced. Component losses may be the average or worst case loss. Link impairments may be, for example, reflections. According to some examples, increased power from light source 108 may offset loss in the link budget.

PIC 106 may include grating coupler 122. Grating coupler 122 may couple the beam of light from light source 108 into a waveguide. The PIC may additionally include one or more modulators, edge couplers and/or grating couplers, multiplexers, etc. The multiplexers may couple light from multiple channels to the optical fiber. The edge couplers and/or grating couplers may couple light from one or multiple channels to an optical fiber.

Second end 126 of optics mount 102 may be coupled to PIC 106 such that prism 114 or the MEMS mirrors are positioned above grating coupler 122. The second end 126 of optics mount 102 may be coupled to PIC 106 and/or grating coupler 122. According to some examples, the second end 126 of optics mount 102 may be coupled to PIC 106 and/or grating coupler with optical epoxy 118. According to some examples, optical epoxy may provide an optical path for the beam of light with minimal reflections.

Optics mount 102 may include one or more electrical connections between substrate 104 and PIC 106. For example, the electrical connections may be made through one or more solder bumps. In some examples, the one or more solder bumps may be located in gap 125. Gap 125 may then be filled with epoxy. According to some examples, the solder bumps may be located between the optics mount 102 and substrate 104.

The size of the optics mount 102 may be large when compared to the size of individual components on PIC 106, such as grating coupler 122, edge coupler, waveguide, modulator, multiplexer, etc. The positioning of optics mount 102 may impact or determine the size of PIC 106. To reduce the size of PIC 106, optics mount 102 may be positioned such that optics mount 102 spans between, or across, substrate 104 and PIC 106. For example, only a portion of optics mount 102 may be on positioned on or coupled to each of substrate 104 and PIC 106. This may provide for a physical separation of the thermal attachment region and the optical attachment region. The thermal attachment region is the region where first end 124 of optics mount 102 is coupled to substrate 104. The optical attachment region is the region be where second end 126 of optics mount 102 is coupled to PIC 106. The physical separation between the thermal attachment and optical attachment regions may prevent material mixing and flow during attachment, alignment, and curing and/or fixing operations when assembling integrated optics assembly 100. For example, positioning optics mount 102 as a bridge between substrate 104 and PIC 106 may provide a physical gap 125 that may prevent material mixing of the thermal and optical sides of optics mount 102.

The configuration of integrated optics assembly 100 may allow for increased efficiency when packaging the integrated optics assembly 100. For example, the packaging process may include outsourced assembly and test ("OSAT") for electrical packaging of substrate 104, PIC 106, and integrated circuits. The packaging process may additionally or alternatively include optical packaging of optics mount 102 and a fiber and/or fiber array. This may allow per-laser die burn-in before placement of optics mount 102 on PIC 106.

Figure 2:
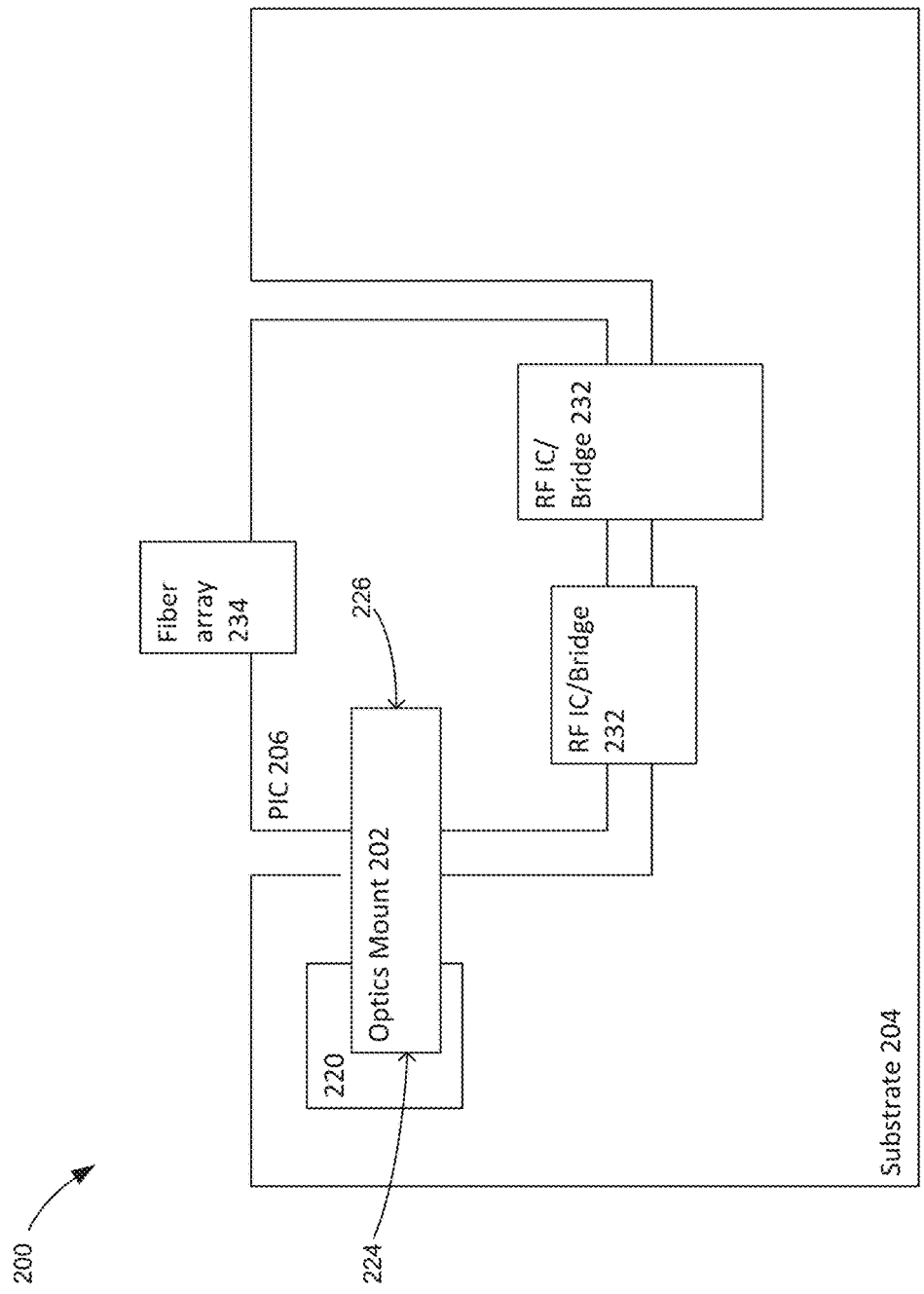
FIG. 2 is a top-down view of an example parallel single mode transceiver according to aspects of the disclosure.

FIG. 2 is a top down view of an example integrated optics assembly. The integrated optics assembly 200 may be configured as a parallel single mode ("PSM") transceiver. The integrated optics assembly 200 may include optics mount 202, substrate 204, heat sink 220, PIC 206, one or more RF ICs or RF bridges 232, and fiber array 234. The substrate 204 may have a u-shape. For example, substrate 204 may have a substantially rectangular shape with a portion of the rectangle removed. The portion of the removed rectangle may be an indentation. PIC 206 may be received in the indentation.

The light source may provide a beam of light. The beam of light may be split into two or more channels or wavelengths. Each channel may be separately modulated by a modulator on PIC 206. Each channel may have a respective fiber for transmission and a corresponding fiber for receiving. The fiber and the corresponding fiber may be optical fibers.

As the light source produces the beam of light, the light source may produce heat. Temperatures above a predetermined threshold may damage the PIC 206 and/or cause thermal rollover. To prevent damage or thermal rollover, a first end 224 of optics mount 202 may be coupled to a region of substrate 204 including heat sink 220. The first end 224 of optics mount 202 may include the light source. A second end 226 of optics mount 202 may be coupled to the PIC. The second end of optics mount 202 may include a prism or MEMS mirror to redirect the beam of light form the light source towards PIC 206 and/or a grating coupler within PIC 206. This configuration may increase the thermal performance of integrated optics assembly 200 as the heat sinking may occur through substrate 204 instead of PIC 206.

Figure 3:
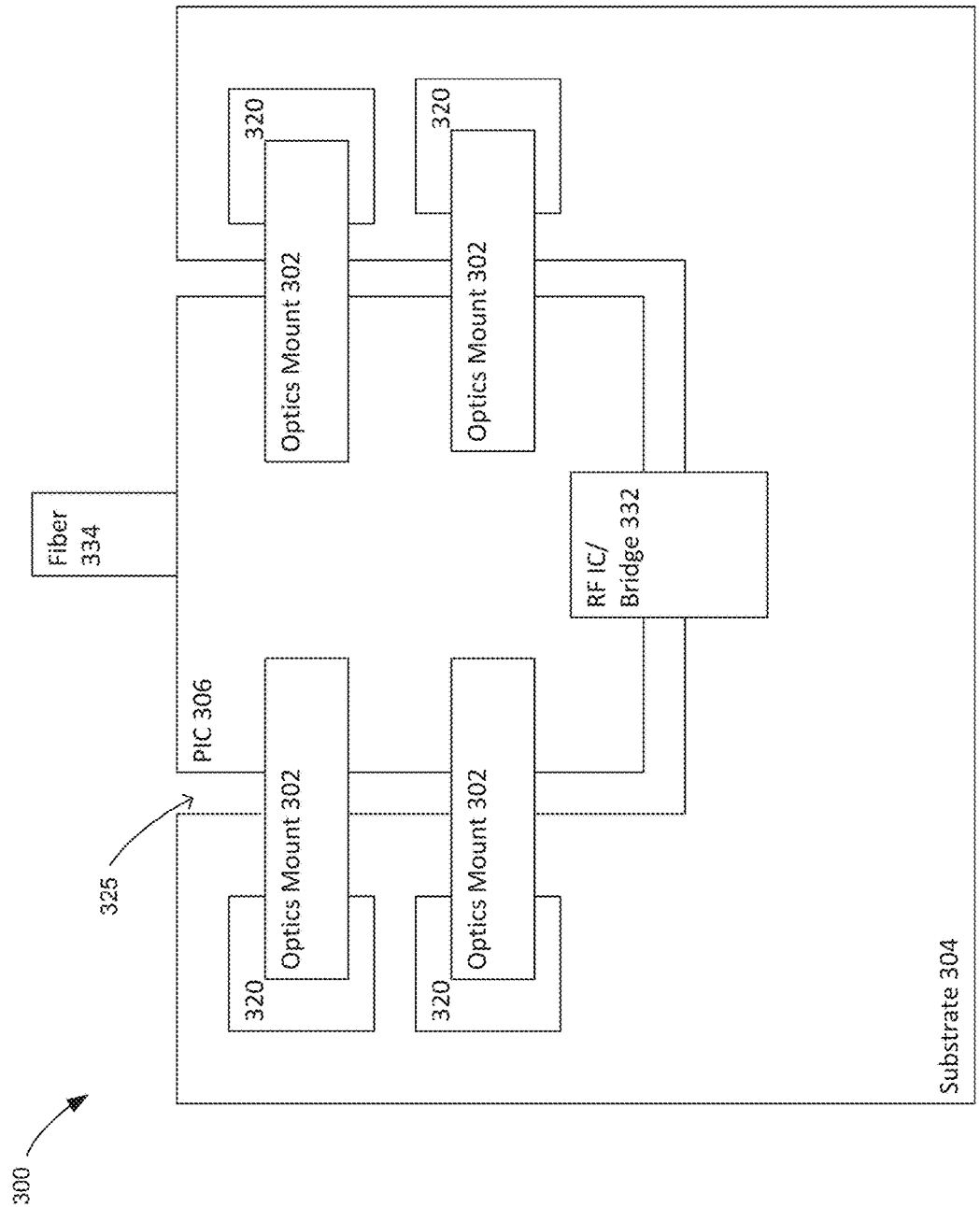
FIG. 3 is a top-down view of an example coarse wavelength division multiplexing transmitter according to aspects of the disclosure.

FIG. 3 is a top down view of another example integrated optics assembly. The integrated optics assembly 300 may be configured as a coarse wavelength division multiplexing ("CWDM") transmitter. The integrated optics assembly 300 may include one or more optics mounts 302, substrate 304, one or more heatsinks 320, PIC 306, an RF IC or RF bridge 332, and fiber 334. Substrate 304 and PIC 306 may have a configuration similar to the configuration described with respect to integrated optics assembly 200. For example, substrate 304 may have a u-shape with an indentation. PIC 306 may be received within the indentation of the u-shape of the substrate 304.

The light source on each of optics mounts 302 may provide a beam of light. Each beam of light may be a different wavelength and/or may correspond to a different channel or signal. The signal received by PIC 306 from each optics mount 302 may be multiplexed onto fiber 334.

As shown in FIG. 3, four optics mounts 302 are positioned around PIC 206 such that each optics mount 302 extends between PIC 306 and substrate 304. Each of the optics mounts 302 may be self-aligned and have features that create a defined gap 325 between substrate 304 and PIC 306. Gap 325 may be filled with optical epoxy.

Figure 4:
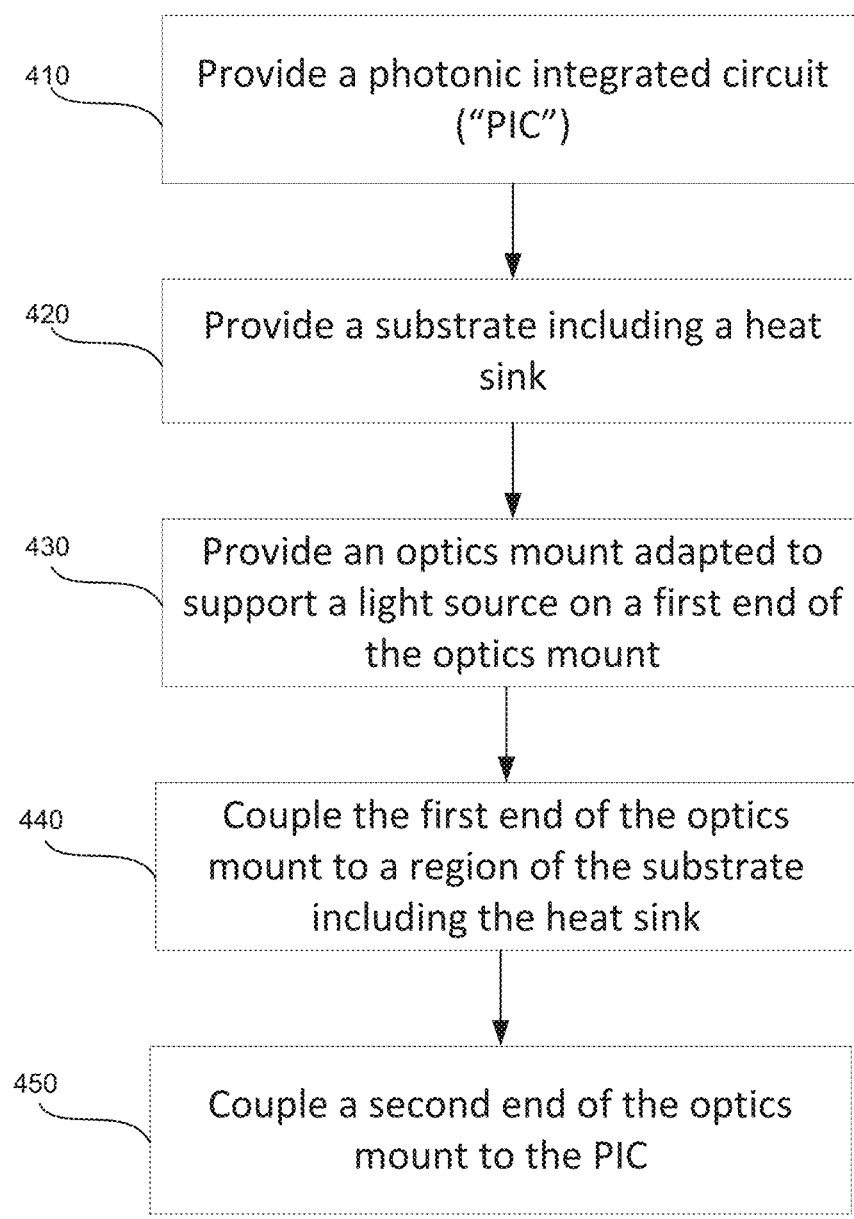
FIG. 4 is a flow diagram illustrating a method of manufacturing an integrated optics assembly according to aspects of the disclosure.

FIG. 4 illustrates an example method of manufacturing an integrated optical assembly. The following operations do not have to be performed in the precise order described below. Rather, various operations can be handled in a different order or simultaneously, and operations may be added or omitted.

For example, in block 410 a PIC is provided. The PIC may include a grating coupler configured to couple a beam of light into a wave guide. The PIC may additionally include one or more modulators, edge couplers, multiplexers, etc.

In block 420, a substrate including a heat sink is provided. The heat sink may be thermally conductive. According to some examples, the thermal conductivity of the heat sink may be greater than the thermal conductivity of the PIC. The heat sink may be embedded into substrate such that a top surface of the heat sink is in the same plane as a top surface of the substrate.

In block 430, an optics mount adapted to support a light source on a first end of the optics mount is provided. For example, the optics mount may support a light source on the first end and a prism or MEMS mirror on a second end. The light source may be a laser light. The optics mount may be further adapted to support a lens and/or an isolator. The lens and/or isolator may be positioned between the light source and prism or MEMS mirror.

In block 440, the first end of the optics mount is coupled to a region of the substrate including the heat sink. The light source may be a source of heat. The heat generated by the light source may cause damage to the PIC and/or may cause thermal rollover if the heat is not dissipated.

In block 450, a second end of the optics mount is coupled to the PIC. The second end of the optics mounts may be positioned above the grating coupler of the PIC.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A system comprising:
   a photonic integrated circuit (PIC);
   a substrate or printed circuit board ("PCB") including a heat sink; and
   an optics mount adapted to support a light source on a first end of the optics mount, wherein the optics mount overlies the PIC and the substrate or PCB, and wherein the first end of the optics mount is coupled to a region of the substrate or the PCB including the heat sink and a second end of the optics mount is coupled to the PIC, wherein when the first end of the optics mount is coupled to the region of the substrate or the PCB and the second end of the optics mount is coupled to the PIC, a first edge of the substrate or the PCB and a first edge of the PIC define a gap therebetween.

2. The system of claim 1, wherein the heat sink is embedded in the substrate.

3. The system of claim 2, wherein:
   the heat sink has a first top surface and the substrate or the PCB has a second top surface, and
   the first top surface and the second top surface are on a first plane.

4. The system of claim 1, wherein the optics mount is coupled to the region of the substrate or the PCB via solder or epoxy.

5. The system of claim 1, wherein the heat sink is removably coupled to the substrate or the PCB.

6. The system of claim 1, wherein the second end of the optics mount is coupled to the PIC via optical epoxy.

7. The system of claim 1, wherein the optics mount further includes one or more electrical connections between the substrate or the PCB and the PIC.

8. The system of claim 1, wherein the substrate has a u-shape.

9. The system of claim 8, wherein the PIC is received within an indentation of the u-shaped substrate.

10. The system of claim 1, wherein the optics mount comprises:
    a lens configured to focus a beam of light from the light source; and
    a prism or a microelectromechanical systems (MEMS) mirror positioned on the second end of the optics mount, wherein the prism or the MEMS mirror is configured to receive the beam of light from the lens and redirect it towards the PIC.

11. The system of claim 1, further comprising a plurality of optics mounts, wherein the first end of each of the plurality of optics mounts is coupled to the substrate or the PCB and the second end of each of the plurality of optics mounts is coupled to the PIC.

12. The system of claim 1, further including a radio frequency integrated circuit or radio frequency bridge configured to couple to both the substrate or the PCB and the PIC.

13. A method of manufacturing an integrated optical assembly comprising:
    providing a photonic integrated circuit (PIC);
    providing a substrate including a heat sink;
    providing an optics mount that overlies the PIC and the substrate, the optics mount adapted to support a light source on a first end of the optics mount;
    coupling the first end of the optics mount to a region of the substrate including the heat sink; and
    coupling a second end of the optics mount to the PIC,
    wherein when the first end of the optics mount is coupled to the region of the substrate and the second end of the optics mount is coupled to the PIC, a first edge of the substrate and a first edge of the PIC define a gap therebetween.

14. The method of claim 13, further comprising embedding the heat sink in the substrate such that a first top surface of the heat sink and a second top surface of the substrate are on a first plane.

15. The method of claim 13, further comprising:
    providing a lens configured to focus a beam of light from the light source;
    providing a prism or a microelectromechanical systems (MEMS) mirror, wherein the prism or the MEMS mirror is configured to receive the beam of light from the lens and redirect it towards the PIC;
    coupling the lens to the optics mount; and
    coupling the prism or MEMS mirror to the second end of the optics mount, wherein the lens is positioned between the light source and the prism or MEMS mirror.

16. The method of claim 13, further comprising embedding the heat sink in the substrate.

17. The method of claim 16, wherein embedding the heat sink further comprises aligning a first top surface of the heat sink with a second top surface of the substrate such that the first top surface and the second top surface are each on a first plane.

18. The method of claim 13, wherein the substrate has a u-shape such that providing the PIC further includes providing the PIC within an indentation of the u-shaped substrate.

* * * * *